(12) United States Patent
Beauchemin et al.

(10) Patent No.: US 11,348,859 B2
(45) Date of Patent: May 31, 2022

(54) THERMOELECTRIC COOLER (TEC) FOR SPOT COOLING OF 2.5D/3D IC PACKAGES

(71) Applicant: Google LLC, Mountain View, CA (US)

(72) Inventors: Melanie Beauchemin, Mountain View, CA (US); Madhusudan Iyengar, Foster City, CA (US); Christopher Malone, Mountain View, CA (US); Gregory Imwalle, Los Altos, CA (US)

(73) Assignee: Google LLC, Mountain View, CA (US)

( * ) Notice: Subject to any disclaimer, the term of this patent is extended or adjusted under 35 U.S.C. 154(b) by 200 days.

(21) Appl. No.: 16/596,100

(22) Filed: Oct. 8, 2019

(65) Prior Publication Data
US 2020/0035583 A1    Jan. 30, 2020

Related U.S. Application Data

(62) Division of application No. 15/696,962, filed on Sep. 6, 2017, now Pat. No. 10,504,816.

(51) Int. Cl.
*H01L 21/52* (2006.01)
*H01L 23/38* (2006.01)
(Continued)

(52) U.S. Cl.
CPC .............. *H01L 23/38* (2013.01); *F25B 21/02* (2013.01); *H01L 21/4882* (2013.01);
(Continued)

(58) Field of Classification Search
CPC ......... H01L 23/23; H01L 25/50; H01L 21/52; H01L 21/4882; H01L 21/02
See application file for complete search history.

(56) References Cited

U.S. PATENT DOCUMENTS 6,094,919 A    8/2000  Bhatia
7,436,059 B1   10/2008 Ouyang
(Continued)

FOREIGN PATENT DOCUMENTS

CN    103137577 A    6/2013
CN    103378017 A    10/2013
(Continued)

OTHER PUBLICATIONS

Extended European Search Report for European Patent Application No. 20189993.7 dated Dec. 23, 2020. 7 pages.
(Continued)

*Primary Examiner* — Hoa B Trinh
(74) *Attorney, Agent, or Firm* — Lerner, David, Littenberg, Krumholz & Mentlik, LLP

(57) ABSTRACT

While the use of 2.5D/3D packaging technology results in a compact IC package, it also raises challenges with respect to thermal management. Integrated component packages according to the present disclosure provide a thermal management solution for 2.5D/3D IC packages that include a high-power component integrated with multiple lower-power components. The thermal solution provided by the present disclosure includes a mix of passive cooling by traditional heatsink or cold plate and active cooling by thermoelectric cooling (TEC) elements. Certain methods according to the present disclosure include controlling a temperature during normal operation in an IC package that includes a plurality of lower-power components located adjacent to a high-power component in which the high-power component generates a greater amount of heat relative to each of the lower-power components during normal operation.

16 Claims, 8 Drawing Sheets

(51) Int. Cl.
| | |
|---|---|
| *H01L 25/18* | (2006.01) |
| *H01L 23/053* | (2006.01) |
| *H01L 23/433* | (2006.01) |
| *H01L 25/00* | (2006.01) |
| *H01L 21/48* | (2006.01) |
| *F25B 21/02* | (2006.01) |
| *H01L 23/473* | (2006.01) |

(52) U.S. Cl.
CPC ............ *H01L 21/52* (2013.01); *H01L 23/053* (2013.01); *H01L 23/433* (2013.01); *H01L 25/18* (2013.01); *H01L 25/50* (2013.01); *F25B 2321/023* (2013.01); *F25B 2321/0251* (2013.01); *H01L 23/473* (2013.01); *H01L 2924/1433* (2013.01); *H01L 2924/1434* (2013.01)

(56) References Cited

U.S. PATENT DOCUMENTS

| | | | |
|---|---|---|---|
| 9,269,694 | B2 | 2/2016 | Chen et al. |
| 9,812,373 | B2* | 11/2017 | Fachmann .......... H01L 23/3736 |
| 2011/0032679 | A1 | 2/2011 | Baek et al. |
| 2011/0042805 | A1 | 2/2011 | Yu et al. |
| 2013/0139524 | A1 | 6/2013 | Kim et al. |
| 2015/0035134 | A1* | 2/2015 | Hung .................. H01L 24/32 257/712 |
| 2015/0062824 | A1 | 3/2015 | Hyun et al. |
| 2015/0162307 | A1 | 6/2015 | Chen et al. |
| 2016/0343929 | A1 | 11/2016 | Yu et al. |
| 2017/0229373 | A1 | 8/2017 | Kim et al. |

FOREIGN PATENT DOCUMENTS

| | | |
|---|---|---|
| CN | 104716109 A | 6/2015 |
| EP | 3367434 A1 | 8/2018 |
| TW | 200839979 A | 10/2008 |
| TW | 200943500 A | 10/2009 |

OTHER PUBLICATIONS

Office Action for Taiwanese Patent Application No. 107121897 dated Oct. 22, 2019.

Notification of the First Office Action for Chinese Patent Application No. 201880031656.6 dated Apr. 23, 2020. 8 pages.

Hirachan, Agat, "Mitigation of Hot-Spots in High-End Microprocessors Using Bulk and Thin Film Thermoelectric Coolers", Thesis presented to The University of Texas at Arlington, 122 pages, Dec. 2012. retrieved from URL: https://uta-ir.tdl.org/uta-ir/bitstream/handle/10106/11649/Hirachan uta_ 2502M _ 11924 .pdf?sequence= 1&isAllowed=y.

International Search Report and Written Opinion dated Sep. 21, 2018 in International (PCT) Application No. PCT/US2018/037031.

Office Action dated May 20, 2019 in Taiwanese Patent Application No. 107121897, and English translation thereof.

Snyder, G. Jeffrey, et al. "Hot Spot Cooling using Embedded Thermoelectric Coolers", In Twenty-Second Annual IEEE Semiconductor Thermal Measurement and Management Symposium, 9 pp. 135-143, Mar. 2006.

VVatronix Inc. "Cold Plates" 2 pages, Retrieved on Sep. 6, 2017 from URL: http://www.inbthermoelectric.com/assemblies/cold-plates/?gclid=CPqlvsTizdQCFU-4wAoddIUICQ.

* cited by examiner

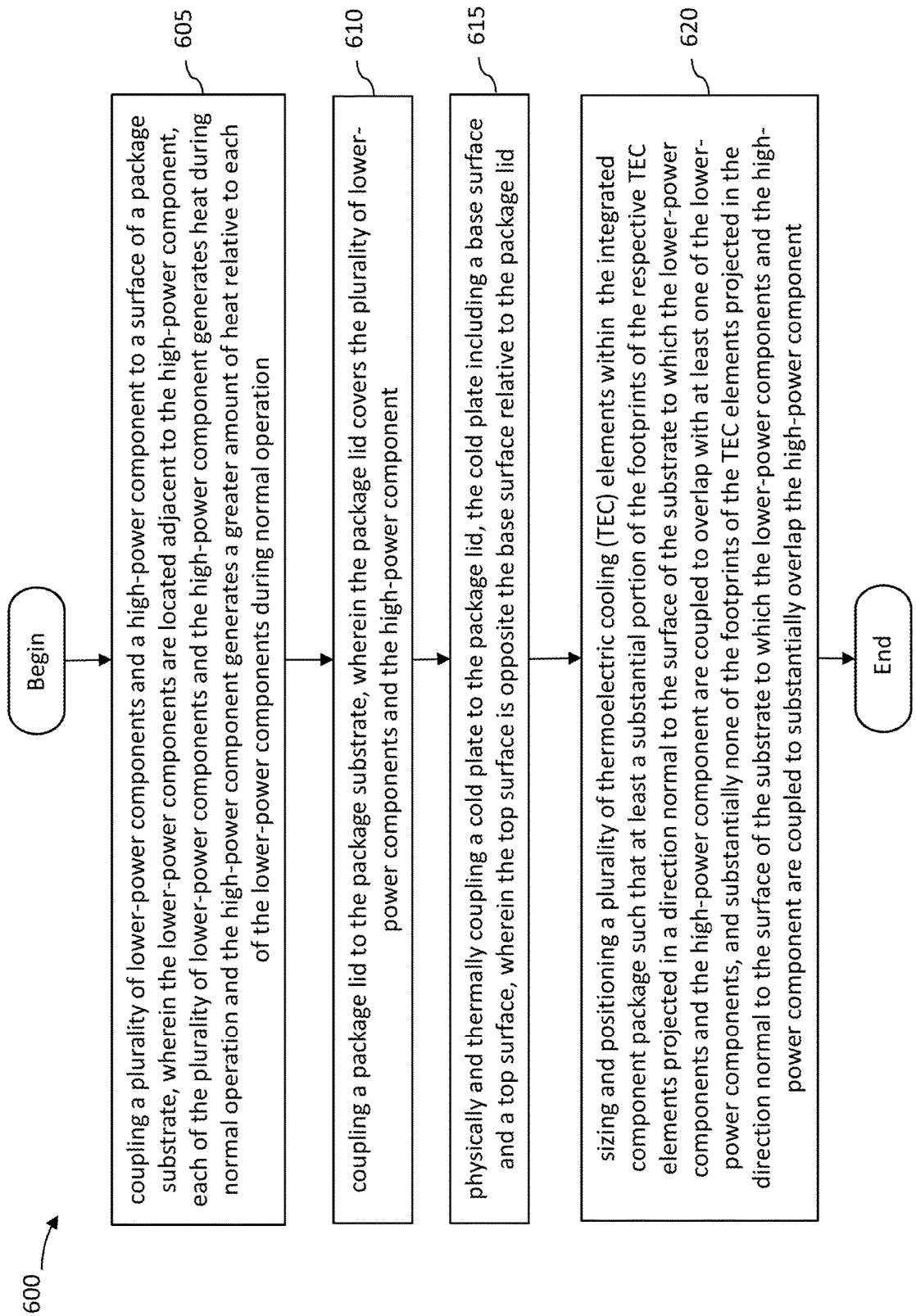

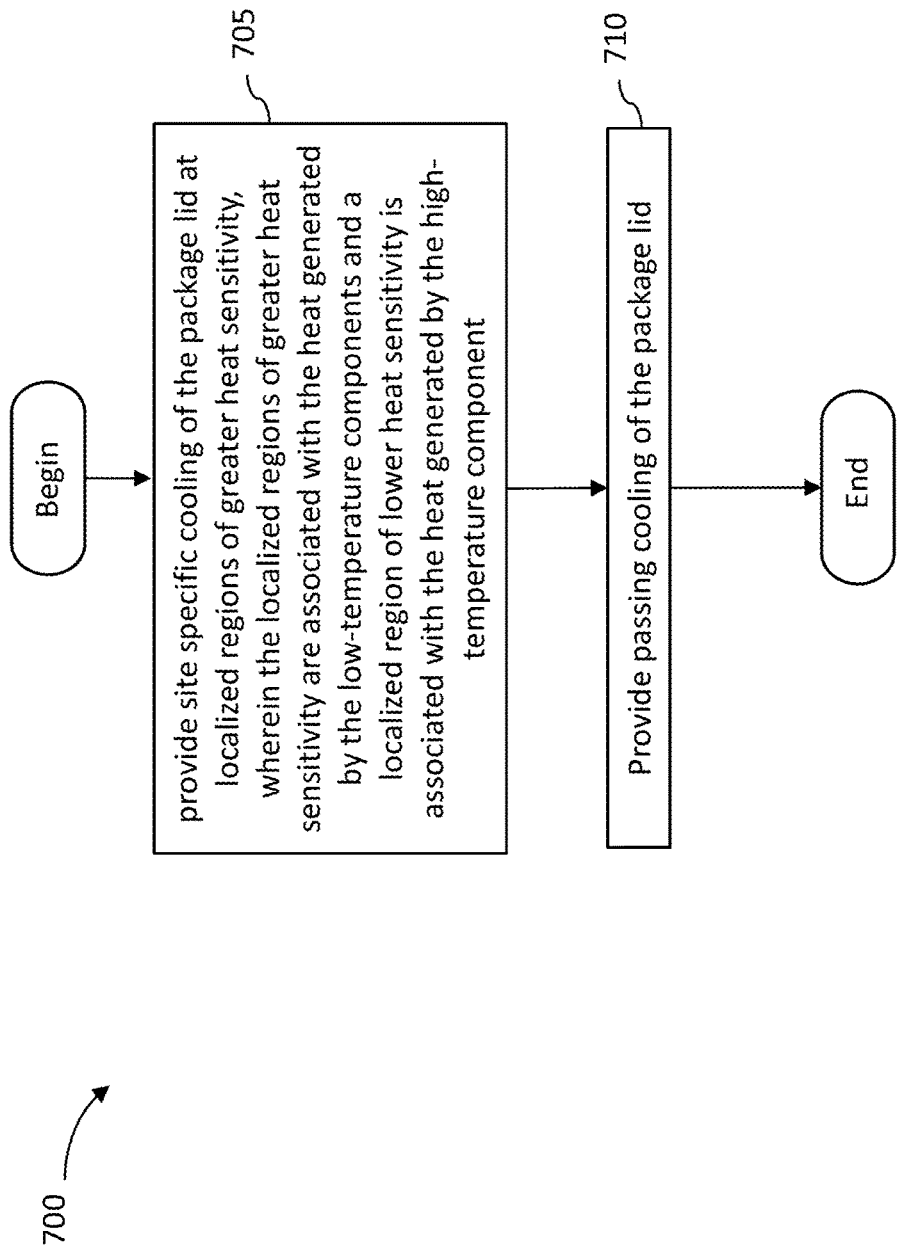

THERMOELECTRIC COOLER (TEC) FOR SPOT COOLING OF 2.5D/3D IC PACKAGES

CROSS-REFERENCE TO RELATED APPLICATIONS

This application is a divisional of U.S. patent application Ser. No. 15/696,962, filed on Sep. 6, 2017, the disclosure of which is incorporated herein by reference.

BACKGROUND

High Bandwidth Memory (HBM) provides memory bandwidth far beyond what is available with traditional memory devices, such as DDR4 and GDDR5, along with cost and power savings. HBM is designed as an in-package memory and is typically located next to a processor or ASIC. Multiple HBM components can be integrated with a single ASIC using 2.5D/3D packaging technology. While the use of 2.5D/3D packaging technology results in a compact IC package, it also raises challenges with respect to thermal management.

SUMMARY

According to one aspect, the subject matter described in this disclosure relates to an integrated component package that includes a plurality of lower-power components and a high-power component coupled to a surface of a package substrate. The lower-power components are located adjacent to the high-power component. Each of the plurality of lower-power components and the high-power component generates heat during normal operation and the high-power component generates a higher amount of heat relative to each of the lower-power components during normal operation. The package includes a package lid that is coupled to the package substrate and covers the plurality of lower-power components and the high-power component. The package includes a cold plate physically and thermally coupled to the package lid, the cold plate including a base surface and a top surface. The top surface of the cold plate is opposite the base surface of the cold plate relative to the package lid. The integrated component package also includes a plurality of thermoelectric cooling (TEC) elements. The TEC elements are sized and positioned within the integrated component package such that at least a substantial portion of the footprints of the respective TEC elements projected in a direction normal to the surface of the substrate to which the lower-power components and the high-power component are coupled to overlap with at least one of the lower-power components. The TEC elements are also sized and positioned such that substantially no portions of the footprints of the TEC elements projected in the direction normal to the surface of the substrate to which the lower-power components and the high-power component are coupled to substantially overlap the high-power component.

According to another aspect, the subject matter described in this disclosure relates to a method of assembling an integrated component package that includes coupling a plurality of lower-power components and a high-power component to a surface of a package substrate. The lower-power components are located adjacent to the high-power component. Each of the plurality of lower-power components and the high-power component generates heat during normal operation and the high-power component generates a higher amount of heat relative to each of the lower-power components during normal operation. The method includes coupling a package lid to the package substrate. The package lid covers the plurality of lower-power components and the high-power component. The method includes physically and thermally coupling a cold plate to the package lid, the cold plate including a base surface and a top surface. The top surface is opposite the base surface relative to the package lid. The method includes sizing and positioning a plurality of thermoelectric cooling (TEC) elements within the integrated component package such that at least a substantial portion of the footprints of the respective TEC elements projected in a direction normal to the surface of the substrate to which the lower-power components and the high-power component are coupled to overlap with at least one of the lower-power components, and substantially none of the footprints of the TEC elements projected in the direction normal to the surface of the substrate to which the lower-power components and the high-power component are coupled to substantially overlap the high-power component.

According to another aspect, the subject matter described in this disclosure relates to a method of controlling a temperature during normal operation in an integrated component package that includes a package lid covering a plurality of lower-power components located adjacent to a high-power component with the high-power component generating a higher amount of heat relative to each of the lower-power components during normal operation. The method includes providing site specific cooling of the package lid at localized regions of greater heat sensitivity. The localized regions of greater heat sensitivity are associated with the heat generated by the lower-power components. The method of controlling a temperature during normal operation in an integrated component package also includes providing cooling of the package lid at a localized region of lower heat sensitivity. The localized region of lower heat sensitivity is associated with the heat generated by the high-temperature component.

BRIEF DESCRIPTION OF THE DRAWINGS

The foregoing will be apparent from the following more particular description of example implementations of the invention, as illustrated in the accompanying drawings. The drawings are not necessarily to scale, emphasis instead being placed upon illustrating implementations of the present invention.

FIG. 6 is a flow diagram of a method for assembling the integrated component packages shown in FIGS. 1-5.

FIG. 7 is a flow diagram of a method for controlling a temperature during normal operation of the integrated component packages shown in FIGS. 1-5.

For purposes of clarity, not every component may be labeled in every figure. The drawings are not intended to be drawn to scale. Like reference numbers and designations in the various figures indicate like elements.

DETAILED DESCRIPTION

Figure 1A:
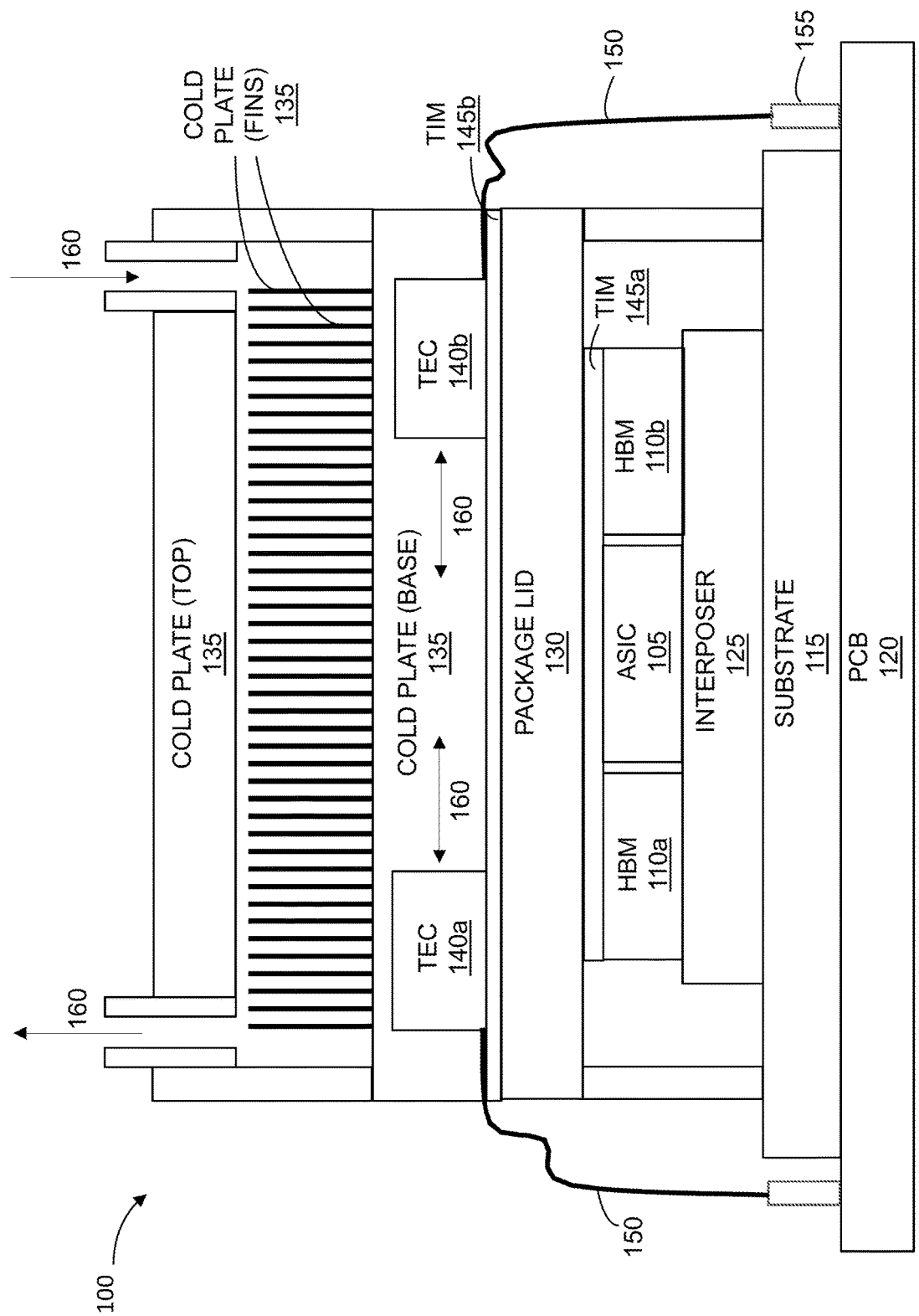
FIG. 1A is a diagram of a side view of a first integrated component package according to an example implementation.

High Bandwidth Memory (HBM) provides memory bandwidth far beyond what is available with traditional memory devices, such as DDR4 and GDDR5, along with cost and power savings. HBM is designed as an in-package memory and is typically located next to a processor or ASIC. Multiple HBM components can be integrated with a single using 2.5D/3D packaging technology. While 2.5D/3D packaging technology results in a compact IC package, it also raises challenges with respect to thermal management. An example 2.5D/3D package may include an ASIC placed at the center of the package surrounded by multiple HBM components. In such a package configuration, the ASIC will typically dissipate about 90% of the entire package power during normal operation. Although, the HBM components dissipate only 10% of the entire package power, they drive the thermal design of the IC package for several reasons. First, the internal thermal resistance (junction-to-case) of the lower-power HBM is typically higher than the internal thermal resistance (junction-to-case) of the high-power ASIC. Additionally, the max junction temperature (Tj) requirement of the lower-power HBM is lower than the max junction temperature (Tj) requirement of the ASIC. That is, the lower-power HBMs are more temperature sensitive than the high-power ASIC. As a result, the package's case temperature or Tcase (defined as the temperature of the package lid or heatsink that is in contact with the base of a cold plate) requirement with the lower-power HBM components is much lower than it would be if the package did not include the lower-power HBM components at all or if the lower-power HBM components had a lower junction-to-case thermal resistance than the high-power ASIC. As a result, a heatsink (or cold plate) used with such a package typically needs to have a very low thermal resistance (less than 0.04 C/W) in order to meet the package's target Tcase requirement. However, achieving such a low thermal resistance for the heatsink (or cold plate) is complex and costly. Therefore, it is desirable to have a thermal management solution for 2.5D/3D IC packages having a high-power component integrated with multiple lower-power components that reduce the temperature of the lower-power components during normal operation with reduced impact on the thermal performance requirements of the package's heatsink (or cold plate).

Integrated component packages according to the present disclosure provide a thermal management solution for 2.5D/3D IC packages that include a high-power component integrated with multiple lower-power components that reduces the temperature of the lower-power components during normal operation without undue impact on the thermal performance requirements of the package's heatsink or cold plate. The thermal solution provided by the present disclosure includes a mix of passive cooling by a traditional heatsink or cold plate and active cooling by thermoelectric cooling (TEC) elements. Typically, heatsink or cold plate cooling is more economical than TEC cooling, because for a given heat source, as the temperature gradient between the hot side and cold side of the TEC element increases, the TEC element's coefficient of performance (COP) can decrease to well below 1. Therefore, implementations according to the present disclosure handle the bulk of the package's heat dissipation with a heatsink/cold plate, while auxiliary heat dissipation is provided by TEC elements in localized regions of greater heat sensitivity and lower power consumption (and therefore lower heat generation). For example, in a package including lower-power and more heat sensitive HBM components and high-power and less heat sensitive ASIC component, the TECs are located in the package such that the footprints of the TEC elements generally overlap portions of the lower-power HBM components and substantially no portions of the footprints of the TEC elements overlap the high-power ASIC component. In some implementations, the TEC footprints may fully cover the HBM components. In some implementations, the TEC footprints may only cover a small fraction of the surface area of the HBM components. The placement of the TEC elements relative to other package components helps decrease the temperature at the localized regions of the package lid covering the lower-power, more temperature sensitive HBM components. Further, placing the TEC elements in localized regions of lower heat dissipation exposes the TEC elements to smaller temperature gradients between the hot and cold side of the TEC elements, thereby improving the COP of the TEC elements relative to TECs proximate to higher-power dissipating components. Additionally, offloading a portion of the cooling of the lower-power HBM components to the TEC elements allows the use of a simpler, less expensive heatsink (or cold plate) with a higher thermal resistance (and higher Tcase) while still keeping the lower-power HBM components within their more stringent thermal specifications.

Certain methods according to the present disclosure include controlling a temperature during normal operation in an IC package that includes a plurality of lower-power components located adjacent to a high-power component in which the high-power component generates a higher amount of heat relative to each of the lower-power components during normal operation. The methods for controlling the temperature in the IC package further include providing site specific cooling of the package lid at localized regions of greater heat sensitivity. The localized regions of greater heat sensitivity are proximate the lower-power components while localized regions of lower heat sensitivity are proximate the high-power component. The methods for controlling the temperature in the IC package also include providing traditional, passive cooling of the package lid. In some implementations, the entire package lid, including the regions cooled by the TEC elements can be cooled by traditional passive cooling.

Figure 1B:
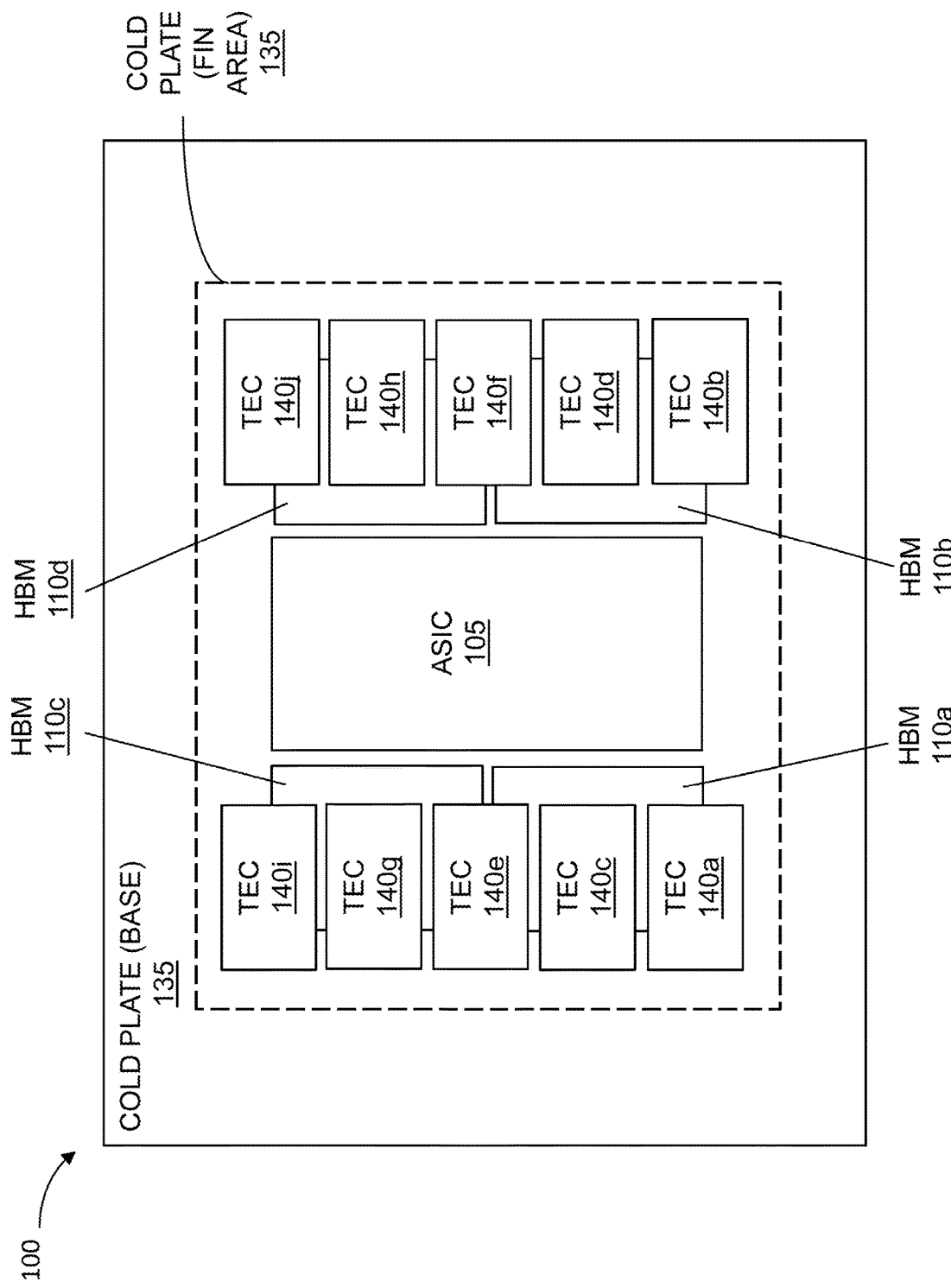
FIG. 1B is a diagram of a top down view of the integrated component package shown in FIG. 1A.

FIG. 1A is a diagram of a side view of a first integrated component package 100 according to an example implementation. FIG. 1B is a diagram of a top down view of the first integrated component package 100 shown in FIG. 1A. The first integrated component package 100 includes four lower-power components such as the HBMs 110a-110d (collectively referred to as HBMs 110) shown in FIG. 1B. Only the first and second HBMs 110a and 110b are shown in FIG. 1A. The first integrated component package configuration also includes a high-power component such as an ASIC 105. The lower-power HBMs 110 are located adjacent to the high-power ASIC 105. During normal operation, the lower-power HBMs 110 and the high-power ASIC 105 generate heat with the high-power ASIC 105 generating a greater amount of heat relative to each of the lower-power HBMs 110.

The lower-power HBMs 110 and the high-power ASIC 105 are coupled to a surface of a package substrate 115 via an interposer 125. The lower-power HBMs 110 and the high-power ASIC 105 are electrically connected to a PCB 120 via the interposer 125 and the package substrate 115. The first integrated component package configuration also includes a package lid 130 that is coupled to the package substrate 115. The package lid 130 covers the plurality of lower-power HBMs 110 and the high-power ASIC 105. A first thermal interface material (TIM) 145a deposited between the package lid 130 and the lower-power HBMs 110 and the high-power ASIC 105 reduces the contact resistance and increases the thermal coupling between the package lid 130 and the lower-power HBMs 110 and the high-power ASIC 105 during normal operation.

The first integrated component package 100 also includes a cold plate 135 that is physically and thermally coupled to the package lid 130. The cold plate 135 includes a base surface and a top surface that is opposite the base surface relative to the package lid 130. The cold plate 135 also includes a plurality of fins. A second thermal interface material (TIM) 145b deposited between the base surface of the cold plate 135 and the package lid 130 reduces the contact resistance and increases the thermal coupling between the cold plate 135 and the package lid 130 during normal operation.

The first integrated component package 100 includes a plurality of thermoelectric cooling (TEC) elements such as the TECs 140a-140j (collectively referred to as TECs 140) shown in the top down view of FIG. 1B. Only the first and second TECs 140a and 140b are shown in the side view of FIG. 1A. Referring to FIG. 1B, the TECs 140 are sized and positioned such that at least a substantial portion of the footprints of the respective TECs 140 projected in a direction normal to the surface of the package substrate 115 to which the lower-power HBMs 110 and the high-power ASIC 105 are coupled to overlap with at least one of the lower-power HBMs 110. Therefore, as shown in FIG. 1B, substantially no portions of the footprints of the TECs 140 projected in the direction normal to the surface of the package substrate 115 to which the lower-power HBMs 110 and the high-power ASIC 105 are coupled to substantially overlap the high-power ASIC 105. As shown in FIG. 1B, none of the TEC element footprints overlap the high-power ASIC 105.

In the first integrated component package 100, the TECs 140 are integrated into the cold plate 135 such that a first side of each of the TECs 140 is embedded in the base surface of the cold plate 135 and a second side of each of the TECs 140 is physically and thermally coupled to the package lid 130. A second thermal interface material such as the TIM 145b located between the base surface of the cold plate 135 and the package lid 130 reduces the contact resistance and increases the thermal coupling between the TECs 140, the cold plate 135 and the package lid 130 during normal operation. The TECs 140 are powered by routing one or more electrical connections 150 through the base surface of the cold plate 135 to an external power source 155 on the PCB 120. Using a closed loop control, the voltages and currents of the TECs are adjusted to maintain the max junction temperatures (Tj) of the lower-power HBMs 110 at a target value.

As mentioned above, during normal operation, the lower-power HBMs 110 and the high-power ASIC 105 generate heat with the high-power ASIC 105 generating a greater amount of heat relative to each of the lower-power HBMs 110. Because the lower-power HBMs 110 and the high-power ASIC 105 are thermally coupled to the package lid 130, the heat generated by the lower-power HBMs 110 creates localized regions of lower temperatures in the package lid 130 while the heat generated by the high-power ASIC 105 creates a localized region of higher temperature in the package lid 130. Additionally, the TECs 140 are located away from the high-power ASIC 105 so that the TECs 140 are more impacted by the heat dissipated by the lower-power HBMs 140 and less impacted by the heat generated by the high-power ASIC 105. This placement of the TECs 140 helps decrease the temperature in the localized regions of the package lid 130 covering the lower-power HBMs 110. Further, the placement of the TECs 140 in localized regions of lower temperatures results in smaller temperature gradients between the hot and cold side of the TECs 140, thereby having a lower impact on the COP of the TECs 140 than if the TECs were located more proximate or adjacent to the high-power ASIC 105. Additionally, offloading a portion of the cooling of the lower-power HBMs 110 to the TECs 140 allows the cold plate 135 to have a higher thermal resistance (and higher Tcase) while keeping the lower-power HBMs 110 within thermal specifications. Thus, the use of the TECs 140 reduces the temperature of the lower-power HBMs 110 during normal operation with minimum impact on the thermal performance of the cold plate 135.

Figure 2:
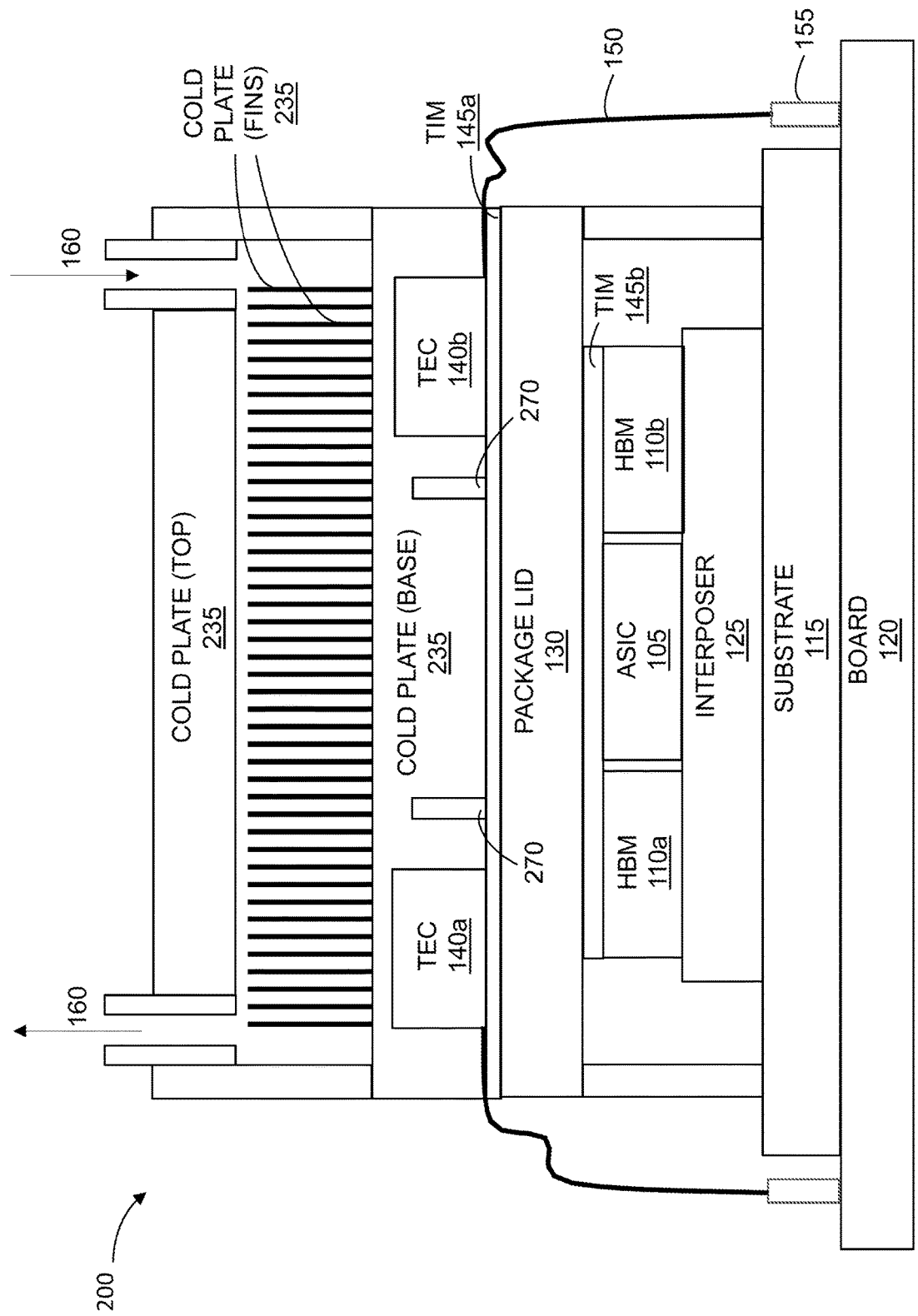
FIG. 2 is a diagram of a side view of a second integrated component package according to an example implementation.

In some implementations, the cold plate may include a plurality of insulating notches or grooves. FIG. 2 is a diagram of a side view of a second integrated component package 200 according to an example implementation. The second integrated component package 200 is similar to the first integrated component package except for the cold plate 235. The base surface of the cold plate 235 includes a plurality of insulating notches 270. Each insulating notch 270 is positioned adjacent to one of the plurality of TECs 140 that are integrated into the base surface of the cold plate 235. During normal operation, the insulating notches 270 minimize the heat spreading from the high-power ASIC 105.

Figure 3:
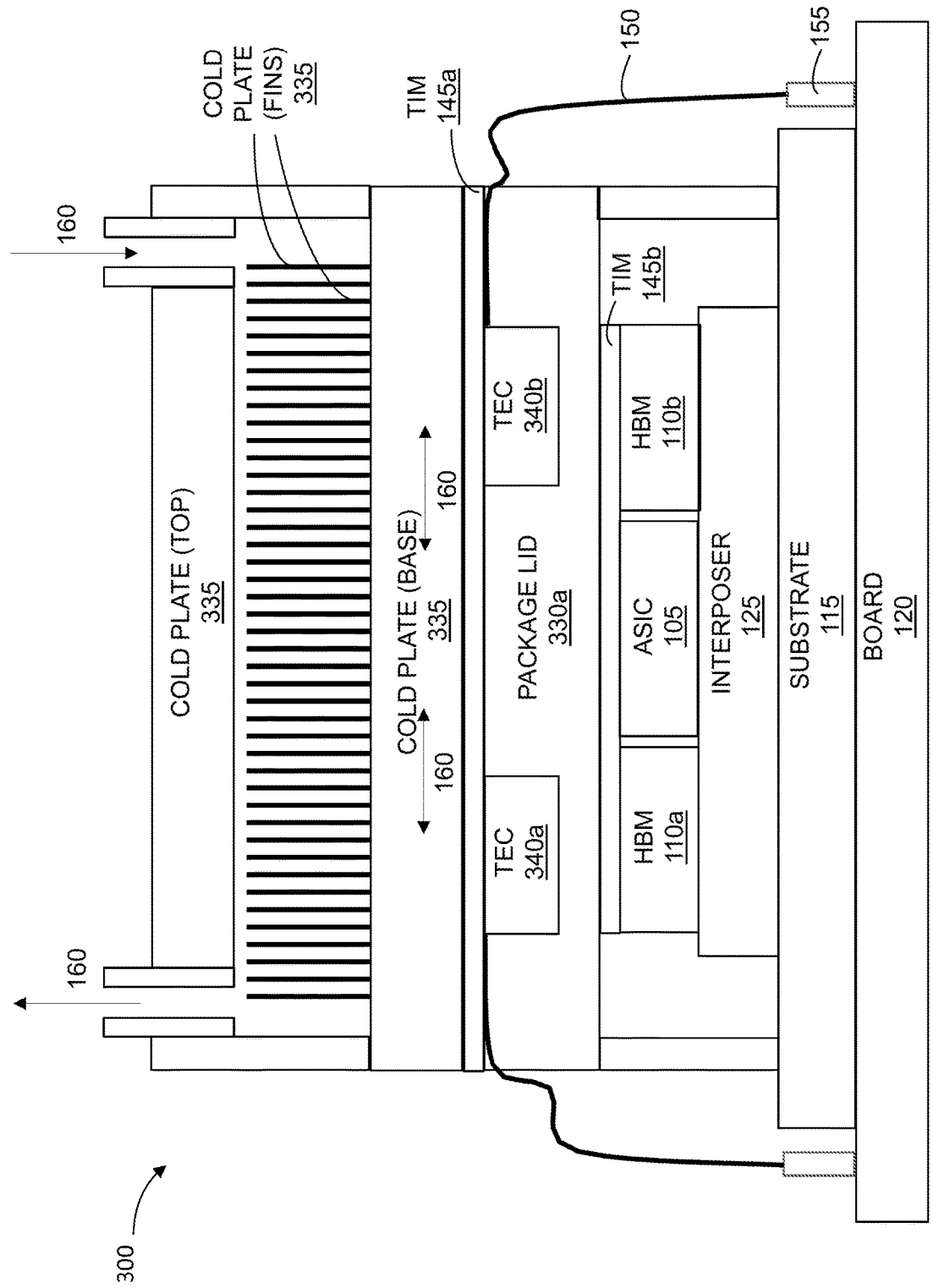
FIG. 3 is a diagram of a side view of a third integrated component package according to an example implementation.
Figure 4:
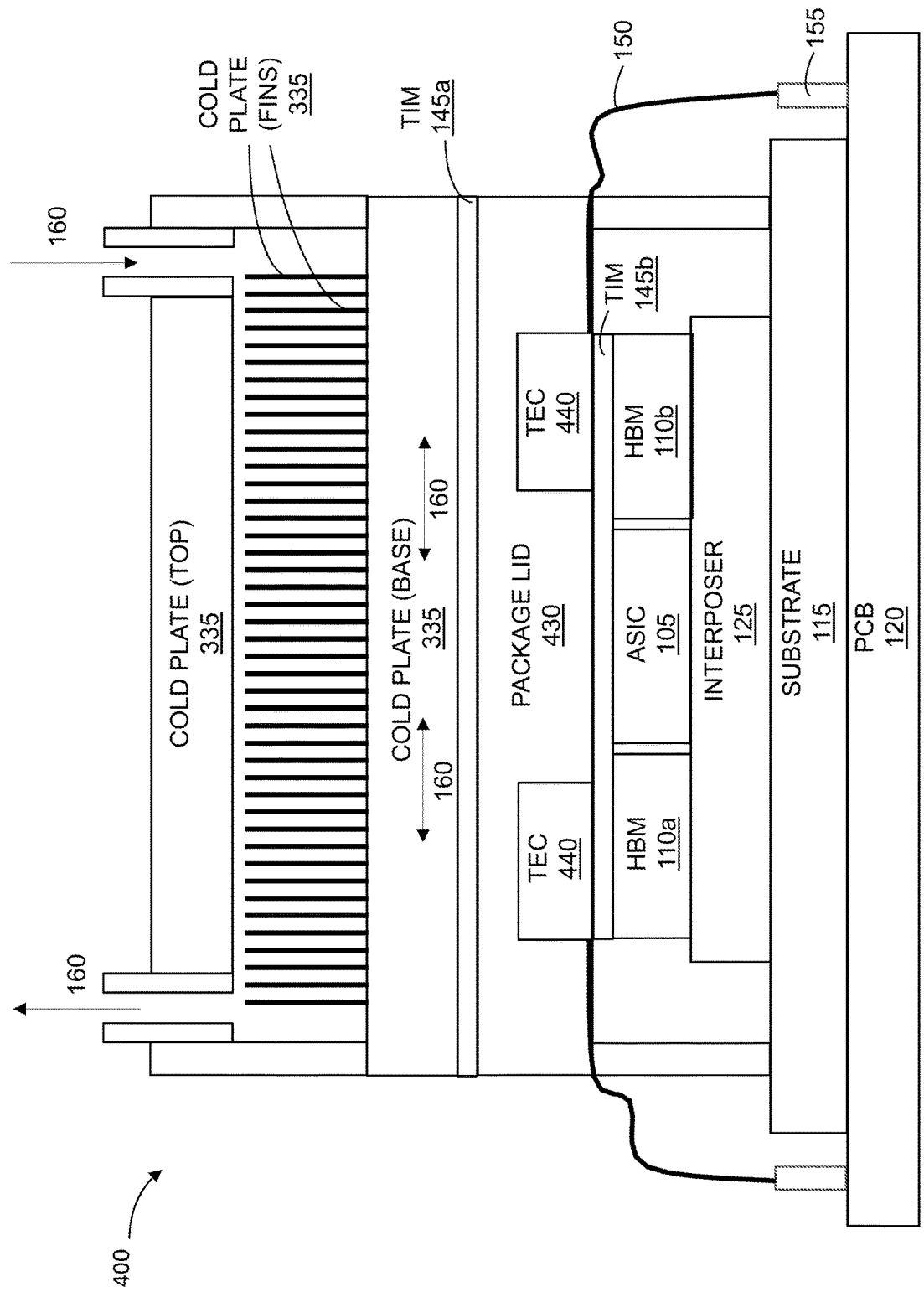
FIG. 4 is a diagram of a side view of a fourth integrated component package according to an example implementation.
Figure 5:
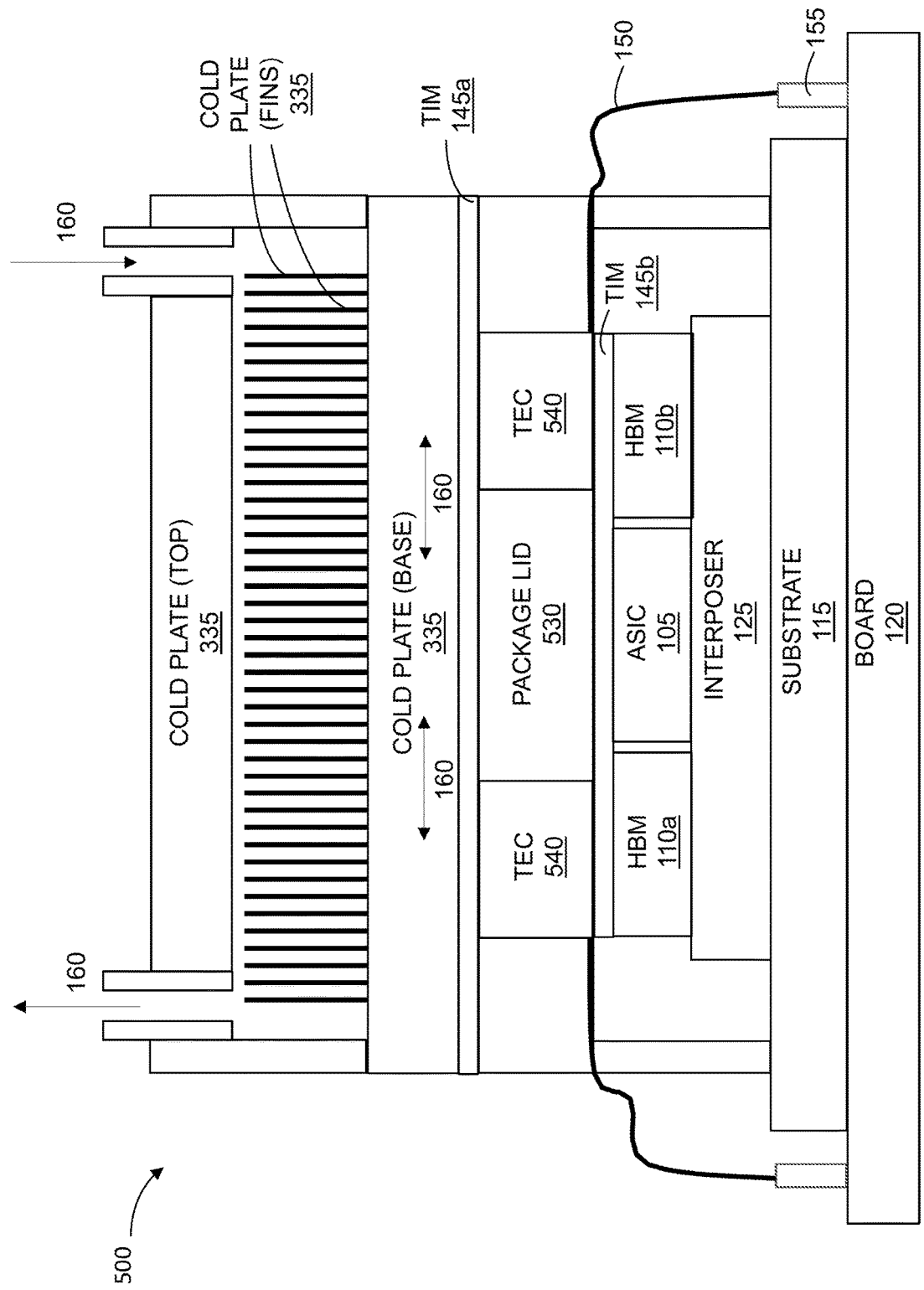
FIG. 5 is a diagram of a side view of a fifth integrated component package according to an example implementation.

In some implementations, the TEC elements may be integrated into the package lid rather than the cold plate. FIGS. 3-5 illustrate package configurations in which the TEC elements are embedded within the package lid. Integrating the TEC elements into the package lid rather than the cold plate places the TEC elements closer to the lower-power HBM components thereby increasing the site specific cooling provided by the TECs at the localized regions of the package lid covering the lower-power, more temperature sensitive HBM components. Placing the TEC elements closer to the HBM components reduces the amount of high-power ASIC-generated heat that is absorbed by the TEC elements and increases the amount of HBM-generated heat that is absorbed by the TEC elements. In some implementations, such as the package configurations shown in FIGS. 3 and 4, ultra-thin TEC elements having a thickness that is less than about 1 mm may be embedded into cavities within the package lid. In other implementations, such as the package configuration shown in FIG. 5, standard off-the-shelf TEC elements having a thickness of about 2 mm to about 4 mm may be integrated with the package lid.

FIG. 3 is a diagram of a side view of a third integrated component package 300 according to an example implementation. The third integrated component package 300 includes a plurality of TECs 340 and a cold plate 335. The TECs 340 are integrated into a package lid 330 such that a first side of each of the TECs 340 is embedded within the package lid 330a and a second side of each of the TECs 340 is physically coupled to the base surface of the cold plate 335. The TECs 340 are powered by routing one or more electrical connections 150 through the package lid 330*a* to an external power source 155 on the PCB 120. Using a closed loop control, the voltages and currents of the TECs 340 are adjusted to maintain the max junction temperatures (Tj) of the lower-power HBMs 110 at a target value.

FIG. 4 is a diagram of a side view of a fourth integrated component package 400 according to an example implementation. The fourth integrated component package 400 is similar to the third integrated component package 300 except for the package lid 430. The fourth integrated component package 400 includes a plurality of TECs 440 that are integrated into a package lid 430 such that a first side of each of the TECs 440 is embedded the package lid 430 and a second side of each of the TECs 440 is physically and thermally coupled to the lower-power HBMs 110. The TECs 440 are powered by routing one or more electrical connections 150 through the package lid 430 to an external power source 155 on the PCB 120. Using a closed loop control, the voltages and currents of the TECs 440 are adjusted to maintain the max junction temperatures (Tj) of the lower-power HBMs 110 at a target value.

FIG. 5 is a diagram of a side view of a fifth integrated component package 500 according to an example implementation. The fifth integrated component package 500 is similar to the fourth integrated component package 400 except for the package lid 530. The TECs 540 are integrated into a package lid 530 such that a first side of each of the TECs 540 is coupled to the base surface of the cold plate 135 and a second side of each of the TECs 540 is physically coupled to the lower-power HBMs 110. The TECs 540 are powered by routing one or more electrical connections 150 through the package lid 530 to an external power source 155 on the PCB 120. Using a closed loop control, the voltages and currents of the TECs 540 are adjusted to maintain the max junction temperatures (Tj) of the lower-power HBMs 110 at a target value.

In some implementations, each of the TECs is powered independently. In some implementations, the TECs may be sized and positioned to form an array. The redundancy of TECs in the array minimizes the negative impact of individual TECs failing during normal operation. In some implementations, the first and second TIM 145*a* and 145*b* can include thermal grease, thermal glue, thermal gap filler, thermal pad or thermal adhesive.

FIG. 6 is a flow diagram of a method 600 that when executed can result in the packages shown in FIGS. 1-5. The method 600 includes coupling a plurality of lower-power components and a high-power component to a surface of a package substrate, such that the lower-power components are located adjacent to the high-power component (stage 605). Each of the plurality of lower-power components and the high-power component generates heat during normal operation and the high-power component generates a greater amount of heat relative to each of the lower-power components during normal operation. The method 600 further includes coupling a package lid to the package substrate, such that the package lid covers the plurality of lower-power components and the high-power component (stage 610). The method 600 further includes physically and thermally coupling a cold plate to the package lid, the cold plate including a base surface and a top surface, wherein the top surface is opposite the base surface relative to the package lid (stage 615). The method 600 also includes sizing and positioning a plurality of thermoelectric cooling (TEC) elements within the integrated component package such that at least a substantial portion of the footprints of the respective TEC elements projected in a direction normal to the surface of the substrate to which the lower-power components and the high-power component are coupled to overlap with at least one of the lower-power components, and substantially none of the footprints of the TEC elements projected in the direction normal to the surface of the substrate to which the lower-power components and the high-power component are coupled to substantially overlap the high-power component (stage 620).

An example implementation of the method 600 when executed results in an integrated component packages shown in FIGS. 1-5. As mentioned above, the method 600 includes coupling a plurality of lower-power components (e.g. the HBMs 110) and a high-power component (e.g. an ASIC 105) to a surface of a package substrate 115, wherein the lower-power HBMs 110 are located adjacent to the high-power ASIC 105 and each of the plurality of lower-power HBMs 110 and the high-power ASIC 105 generates heat during normal operation and the high-power ASIC 105 generates a greater amount of heat relative to each of the lower-power HBMs 110 during normal operation (stage 605). The method 600 further includes coupling a package lid 130 to the package substrate 115, wherein the package lid 130 covers the plurality of lower-power HBMs 110 and the high-power ASIC 105 (stage 610). The method 600 further includes physically and thermally coupling a cold plate 135 to the package lid 130, the cold plate 135 including a base surface and a top surface, wherein the top surface is opposite the base surface relative to the package lid 130 (stage 615). The method 600 also includes sizing and positioning a plurality of TECs 140 within the integrated component package such that at least a substantial portion of the footprints of the respective TECs 140 projected in a direction normal to the surface of the substrate 115 to which the lower-power HBMs 110 and the high-power ASIC 105 are coupled to overlap with at least one of the lower-power HBMs 110, and substantially none of the footprints of the TECs 140 projected in the direction normal to the surface of the substrate 115 to which the lower-power HBMs 110 and the high-power ASIC 105 are coupled to substantially overlap the high-power ASIC 105 (stage 620). In some implementations, stage 620 of the method 600 may include integrating the TECs 140 into the cold plate 135 such that a first side of each of the TECs 140 is embedded in the base surface of the cold plate 135 and a second side of each of the TECs 140 is physically coupled to the package lid 130. As shown in the second integrated component package configuration 200 of FIG. 2, in some implementations, stage 620 of the method 600 may include integrating the TECs 140 into a base surface of a cold plate 235 that includes a plurality of insulating notches 270. Each insulating notch 270 is positioned adjacent to one of the plurality of TECs 140 that are integrated into the base surface of the cold plate 235. As shown in the third integrated component package configuration 300 of FIG. 3, in some implementations, stage 620 of the method 600 may include integrating a plurality of TECs 340 into a package lid 330 such that a first side of each of the TECs 340 is embedded in the package lid 330 and a second side of each of the TECs 340 is physically coupled to the base surface of a cold plate 335. In some implementations, such as the fourth integrated component package configuration 400 shown in FIG. 4, stage 620 of the method 600 may include integrating a plurality of TECs 440 into a package lid 430 such that a first side of each of the TECs 440 is embedded the package lid 430 and a second side of each of the TECs 440 is physically coupled to the lower-power HBMs 110. In some implementations, such as the fifth integrated component package configuration 500 shown in FIG. 5, stage 620 of the method 600 may include integrating a plurality of TECs 540 into a package lid 530 such that a first side of each of the TECs 540 is physically coupled to the base surface of the cold plate 135 and a second side of each of the TECs 540 is physically coupled to the lower-power HBMs 110.

FIG. 7 is a flow diagram of a method 700 that when executed controls a temperature in the integrated component packages shown in FIGS. 1-5 during normal operation. As mentioned above, the integrated component packages shown in FIGS. 1-5 include a package lid covering a plurality of lower-power components located adjacent to a high-power component with the high-power component generating a higher amount of heat relative to each of the lower-power components during normal operation. The method 700 includes providing site specific cooling of the package lid at localized regions of greater heat sensitivity, wherein the localized regions of greater heat sensitivity are adjacent the lower-power components and a localized region of lower heat sensitivity is adjacent the high-temperature component (stage 705). The method 700 also includes providing cold plate cooling of some or all of the package lid (stage 710).

While the primary example of a lower-power and more heat sensitive package component discussed herein is an HBM component, other components having similar thermal properties and constraints, such as low max junction temperature and high internal thermal resistance, may be included within the integrated package configurations shown in FIGS. 1-5 (and discussed in FIGS. 6 and 7) for active cooling by TEC elements instead of or addition to HBM components.

While this specification contains many specific implementation details, these should not be construed as limitations on the scope of any inventions or of what may be claimed, but rather as descriptions of features specific to particular implementations of particular inventions. Certain features that are described in this specification in the context of separate implementations can also be implemented in combination in a single implementation. Conversely, various features that are described in the context of a single implementation can also be implemented in multiple implementations separately or in any suitable sub-combination. Moreover, although features may be described above as acting in certain combinations and even initially claimed as such, one or more features from a claimed combination can in some cases be excised from the combination, and the claimed combination may be directed to a sub-combination or variation of a sub-combination.

Similarly, while operations are depicted in the drawings in a particular order, this should not be understood as requiring that such operations be performed in the particular order shown or in sequential order, or that all illustrated operations be performed, to achieve desirable results. In certain circumstances, multitasking and parallel processing may be advantageous. Moreover, the separation of various system components in the implementations described above should not be understood as requiring such separation in all implementations, and it should be understood that the described program components and systems can generally be integrated together in a single software product or packaged into multiple software products.

References to "or" may be construed as inclusive so that any terms described using "or" may indicate any of a single, more than one, and all of the described terms. The labels "first," "second," "third," and so forth are not necessarily meant to indicate an ordering and are generally used merely to distinguish between like or similar items or elements.

Various modifications to the implementations described in this disclosure may be readily apparent to those skilled in the art, and the generic principles defined herein may be applied to other implementations without departing from the spirit or scope of this disclosure. Thus, the claims are not intended to be limited to the implementations shown herein, but are to be accorded the widest scope consistent with this disclosure, the principles and the novel features disclosed herein.

What is claimed is:

1. A method comprising:
controlling a temperature during normal operation in an integrated component package that includes a package lid covering a plurality of lower-power components located adjacent to a high-power component and the high-power component generates a higher amount of heat relative to each of the lower-power components during normal operation by:
providing site specific cooling of the package lid at localized regions of greater heat sensitivity, wherein the localized regions of greater heat sensitivity are adjacent the lower-power components and a localized region of lower heat sensitivity is adjacent the high-temperature component; and
providing cold plate cooling of the package lid.

2. The method of claim 1, wherein site specific cooling of the package lid at the localized regions of greater heat sensitivity includes active cooling and cooling of the package lid at the localized region of lower heat sensitivity includes passive cooling.

3. The method of claim 1, wherein:
site-specific active cooling of the package lid is provided by a plurality of thermoelectric cooling (TEC) elements, and
the plurality of TEC elements are sized and positioned within the integrated component package such that at least a substantial portion of the footprints of the respective TEC elements projected in a direction normal to a surface of a substrate to which the lower-power components and the high-power component are coupled to overlap with at least one of the lower-power components, and
substantially none of the footprints of the TEC elements projected in the direction normal to the surface of the substrate to which the lower-power components and the high-power component are coupled to substantially overlap the high-power component.

4. The method of claim 3, wherein the TEC elements are integrated into the cold plate such that a first side of each TEC element is embedded in a base surface of the cold plate and a second side of each TEC element is physically and thermally coupled to the package lid.

5. The method of claim 4, wherein the base surface of the cold plate includes a plurality of insulating notches, each notch positioned adjacent to one of the plurality of TEC elements.

6. The method of claim 3, wherein the TEC elements are integrated into the package lid such that a first side of each TEC element is embedded in the package lid and a second side of each TEC element is physically and thermally coupled to a base surface of the cold plate.

7. The method of claim 3, wherein the TEC elements are integrated into the package lid such that a first side of each TEC is embedded the package lid and a second side of each TEC element is physically and thermally coupled to low power components.

8. The method of claim 3, wherein the TEC elements are integrated into the package lid such that a first side of each TEC element is coupled, and thermally coupled to a base surface of the cold plate and a second side of each TEC element is physically and thermally coupled to the lower power components.

9. The method of claim 3, wherein the TEC elements are integrated into the cold plate such that a first side of each TEC element is embedded in a base surface of the cold plate and a second side of each TEC element is physically and thermally coupled to the package lid.

10. The method of claim 3, wherein a first side of each TEC element is embedded in the package substrate and a second side of each TEC element is physically and thermally coupled to low power components.

11. The method of claim 3, wherein each TEC element is independently powered.

12. The method of claim 1, wherein providing the site-specific cooling further comprises site-specific active cooling of the package lid by positioning a plurality of thermoelectric cooling (TEC) elements within the integrated component package so that at least some of the plurality of TEC elements at least partially overlie at least some of the low-power components and so that the at least some of the plurality of TEC elements are spaced away from the high temperature component.

13. The method of claim 12, wherein the at least some of the plurality of TEC elements are arranged so that the TEC elements do not to overlap with the high temperature component.

14. The method of claim 13, wherein the site-specific cooling of the package lid at the localized region of lower heat sensitivity comprises passive cooling.

15. The method of claim 1, further comprising:
coupling the plurality of lower-power components and the high power component to a surface of a package substrate,
coupling the package lid to the package substrate,
physically and thermally coupling the cold plate to the package lid,
wherein providing site specific cooling of the package lid at localized regions of greater heat sensitivity comprises positioning a plurality of thermoelectric cooling (TEC) elements so that the TEC elements overlap at least one of the lower-power components and so that the TEC elements are spaced away from the high temperature component and do not overlap with the high temperature component.

16. The method of claim 1, wherein the cold plate further comprises a base surface and a top surface, wherein the top surface is opposite the base surface relative to the package lid.

* * * * *